United States Patent

Wu

[11] Patent Number: 5,920,780
[45] Date of Patent: Jul. 6, 1999

[54] METHOD OF FORMING A SELF ALIGNED CONTACT (SAC) WINDOW

[75] Inventor: Chung-Cheng Wu, Hsin-Chu, Taiwan

[73] Assignee: Mosel Vitelic Incorporated, Hsiw-Chu, Taiwan

[21] Appl. No.: 08/791,870

[22] Filed: Jan. 31, 1997

[51] Int. Cl.[6] .................................................. H01L 21/336
[52] U.S. Cl. ........................ 438/301; 438/592; 438/597; 438/787
[58] Field of Search ..................... 438/299, 301, 438/303, 305, 592, 597, 622, 624, 787

[56] References Cited

U.S. PATENT DOCUMENTS

| | | | |
|---|---|---|---|
| 5,073,408 | 12/1991 | Goda et al. | 427/169 |
| 5,270,233 | 12/1993 | Hamatake | 438/305 |
| 5,506,006 | 4/1996 | Chou et al. | 427/430.1 |
| 5,523,251 | 6/1996 | Hong | 438/278 |
| 5,547,900 | 8/1996 | Lin | 438/305 |
| 5,691,240 | 11/1997 | Yang | 438/626 |

*Primary Examiner*—T. N. Quach
*Attorney, Agent, or Firm*—Chi Ping Chang

[57] ABSTRACT

The present invention relates to a method of forming a self-aligned contact (SAC) window employing the liquid phase deposition (LPD) that allows low temperature deposition and selective growing of a LPD-$SiO_2$ film as a stress-buffer layer to prevent WSi peeling during the formation of the SAC window. Specifically, the method comprises the steps of forming a nitride cap and a gate consisting of a WSi layer and a polysilicon layer over a surface of a silicon substrate followed by the formation of the sources and drain regions on the silicon substrate as well as by the process of forming the LPD-$SiO_2$ film. A nitride spacer is formed at a sidewall of the nitride cap and the gate, and the SAC window is then formed by depositing a dielectric layer such as a $SiO_2$ layer followed by exposing through a mask.

4 Claims, 5 Drawing Sheets

METHOD OF FORMING A SELF ALIGNED CONTACT (SAC) WINDOW

DESCRIPTION OF THE PRIOR ART

The dimension of IC chips becomes more miniature to meet a demand for higher integration density and thus results in more narrow space between a contact window and a gate of FET. Hence, the alignment tolerance of a contact mask is more critical than before for preventing short circuit between source/drain regions and a gate, which is a crucial factor of raising yield of IC product in manufacturing processes. Thus, a conventional contact window having a self-alignment between a contact window and a gate is adopted to resolve aforesaid problem and its manufacturing processes are outlined hereafter. A silicon substrate 10 is thermally oxidized to grow a gate oxide 20 to a thickness of 100 Å. A stacked structure of a polysilicon layer, a WSi layer and a nitride layer from bottom to top is sequently deposited and then patterned after exposing, developing and etching the stacked structure, thus forming a nitride cap 33 and a gate consisting of a WSi layer 32 and a polysilicon layer 31, as shown in FIG. 1A. The gate is also called a polycide having low resistivity and is a composite layer consisting of a layer of metal silicide over a layer of polysilicon. The nitride cap 33 is used to protect the underlying gate (i.e. WSi layer 32 and polysilicon layer 31) during a self-align contact (SAC) etching. Subsequently, a source/drain region is formed after one-time ion implantation or two-time ion implantations which are needed in forming a lightly doped drain structure (LDD). An oxide layer 40 deposited by Chemical Vapor Deposition (CVD) is then used as an enhanced stress-buffer layer because the gate oxide 20 is too thin to be a stress-buffer layer between the silicon substrate 10 and a nitride spacer formed in a next process, as shown in FIG. 1B. A stress, resulting from different cofficient of thermal expansion between nitride material and silicon material, will cause a damage to a silicon surface, so a buffer-stress layer is needed to ameliorate a leakage current and a reliability of device caused by dislocation of silicon crystal lattice as the result of the stress of nitride.

Next, a nitride spacer 50 is formed at the sidewall of the stacked structure of the nitride cap 33, the WSi layer 32 and the polysilicon layer 31 after depositing a nitride layer over the exposed surface of the silicon substrate 10 and then etching the nitride layer back by reactive ion etching, as shown in FIG. 1C. Finally, a contact window 70 is formed after depositing a dielectric layer 60 such as $SiO_2$ and then exposing through a contact mask, developing and etching the dielectric layer 60, the oxide layer 40 and the gate oxide 20, as shown in FIG. 1D. Since the nitride spacer 50 has a high etching selectivity with respect to the $SiO_2$ dielectric layer 60, the SAC etching will automatically stop at the nitride spacer 50 and thus a contact window 70 connected to a source/drain region is not spaced apart from a gate, thereby forming a SAC window because of overlapping between a source/drain region and a gate. However, the oxide layer 40 will be etched simultaneously during the SAC etching and thus adhesion between the nitride spacer 50 and the oxide layer 40 is reduced which causes an oxide peeling and an yield loss due to the failure of SAC windows.

Another SAC window is proposed to solve the oxide peeling problem and its key processes are described following. FIG. 2 is a cross-sectional view of a resultant SAC window. An identical number of FIG. 2 is used to represent the same material used in FIG. 1. Most processes of FIG. 2 is the same as that of FIG. 1 except that the oxide layer 40 of FIG. 1 is replaced by a thermal oxide 41 of FIG. 2. Since the thermal oxide 41 is only grown on the surface of the WSi layer 32, the polysilicon layer 31 and the silicon substrate 10 but not grown on the surface of the nitride spacer cap 33, the thermal oxide 41 will be protected by the nitride spacer 50 during a SAC etching and thus solve aforesaid oxide etch loss problem, thereby raising yield. However, a shortcoming of WSi 32 peeling due to a high temperature of thermal oxidation occurs in this conventional SAC window and causes a distortion and nonuniformity of WSi 32 strip lines that can be verified by observing wafers through a microscope. The WSi peeling problem will also result in a big yield loss. Hence, a method of forming a SAC window without WSi peeling is a big issue for a demand of higher yield and integration density.

SUMMARY OF INVENTION

Therefore, an object of the invention is to provide a method of forming a SAC window having a buffer-stress layer.

A further object of the invention is to provide a method of forming a SAC window without WSi peeling, thereby raising yield.

By using of low-temperature and selective oxide-growing characteristics of liquid phase deposition (LPD), according to the invention, a shortcoming of WSi peeling that occurs in a conventional SAC window forming method can be fully prevented, thereby remarkably raising SAC window yield.

BRIEF DESCRIPTION OF THE DRAWINGS

The invention itself, however, as well as other features and advantages thereof, will be best understood by reference to the detailed description which follows, read in conjunction with the accompanying drawings, wherein.

DESCRIPTION OF THE PREFERRED EMBODIMENT

Figure 3:
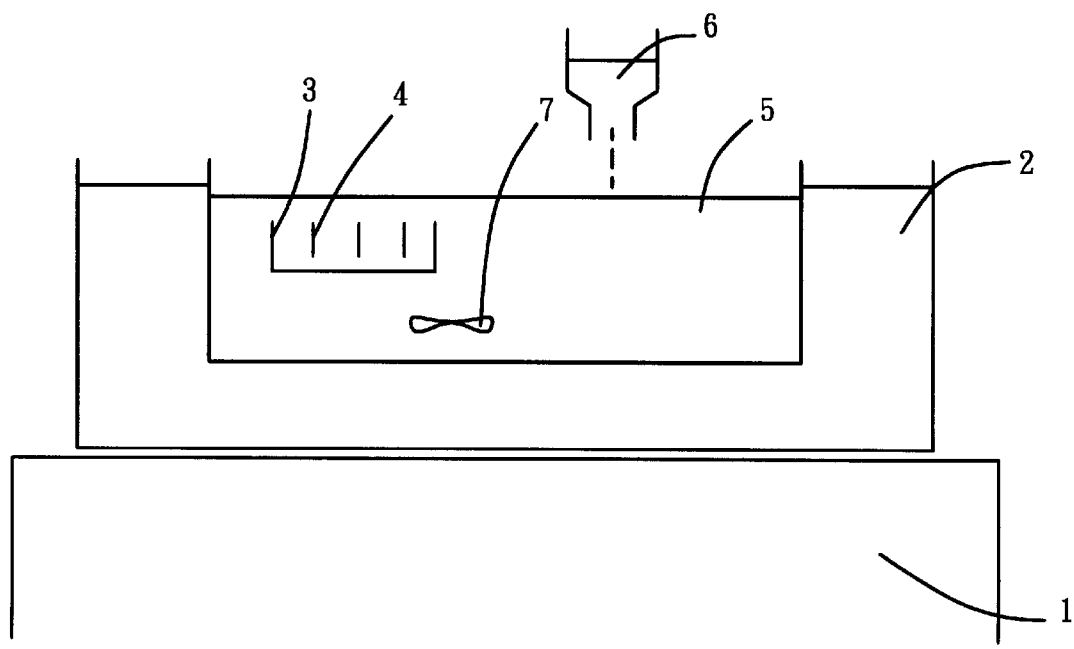
FIG. 3 is an oxide deposition system of liquid-phase deposition.

The invention is based on a selective $SiO_2$ film-formation technology using a liquid-phase deposition (LPD) method, which is disclosed in many literatures, for example, author Tetsuya Homma et al., J. Electrochem. Soc. Vol. 140, No. 8, page 2410, 1993. The LPD-$SiO_2$ film-formation techonlogy is described hereafter. Referring to FIG. 3, the LPD of $SiO_2$ film is carried out in a deposition system which is equipped with a Teflon vessel 5, a water bath 2, an automatically controlled dripper 6 for $H_3BO_3$ aqueous solution, a stirrer 7, and a heater 1. The $H_2SiF_6$ solution is saturated by pure $SiO_2$ powder to a saturated solution which is then transferred to the Teflon vessel 5 for film deposition. To maintain the saturated $H_2SiF_6$ solution supersaturated, pure $H_3BO_3$ aqueous solution is added continuously in the saturated $H_2SiF_6$ solution during the film deposition. The supersaturated $H_2SiF_6$ solution used as a source liquid of LPD is stirred by the stirrer 7 to diffuse the $H_3BO_3$ solution. The wafers 4 are held in a Teflon carrier 3 during the film deposition. The selective deposition mechanism can be explained as siloxane oligomers, which are formed in the supersaturated $H_2SiF_6$ aqueous solution, that have different chemical reactivity between SiO$_2$ substrate surface and other materials. The siloxane oligomers are absorbed to the Si—OH bonds existing at the SiO$_2$ substrate surface, followed by dehydration and chemical bond formation with the SiO$_x$ at the SiO$_2$ substrate surface. Hence, LPD-SiO$_2$ film deposition only occurs on the SiO$_2$ substrate surface, not on the surface of material other than SiO$_2$.

Figure 4A:
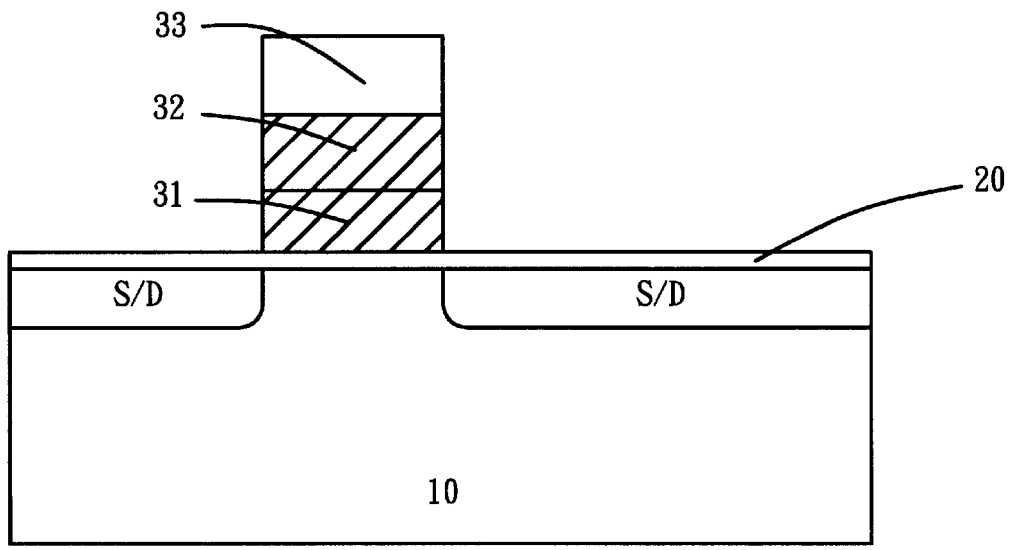
FIGS. 4A–4D are cross-sectional views of crucial steps of manufacturing a SAC window according to the invention.

Referring FIG. 4A, a silicon substrate 10 is thermally oxidized to grow a gate oxide 20 to a thickness of 100 Å. A stacked structure of a polysilicon layer, a WSi layer and a nitride layer from bottom to top is sequentially deposited and then patterned after exposing, developing and etching the stacked structure, thus forming a nitride cap 33 and a gate consisting of a WSi layer 32 and a polysilicon layer 31, as shown in FIG. 4A. The gate is also called a polycide having low resistivity and is a composite layer consisting of a layer of metal silicide over a layer of polysilicon. The nitride cap 33 is used to protect the underlying gate (i.e. WSi 32 and polysilicon layer 31) during a SAC etching. Subsequently, a source/drain region is formed after one-time ion implantation or two-time ion implantations which are needed in forming a lightly doped drain structure (LDD).

Figure 4B:
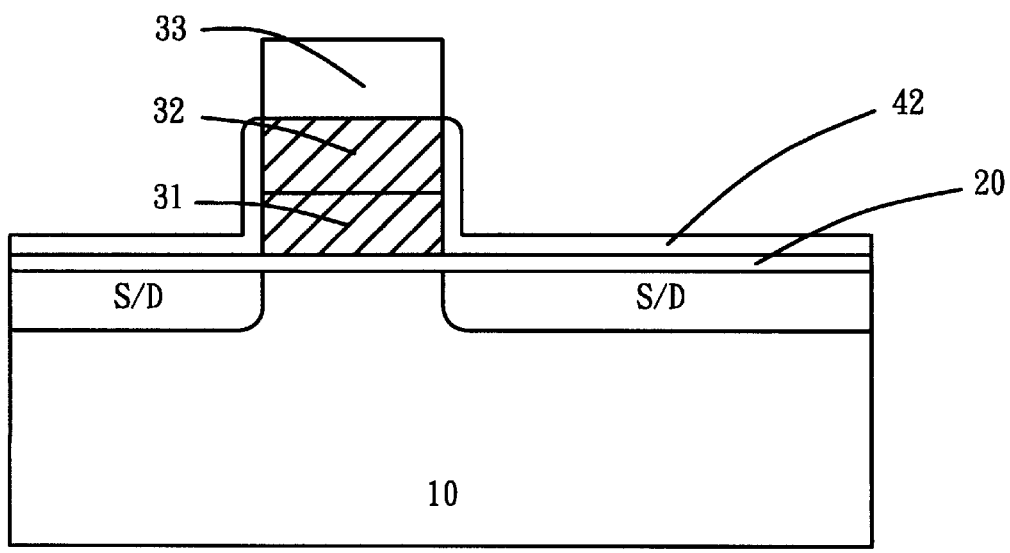
Figure 4C:
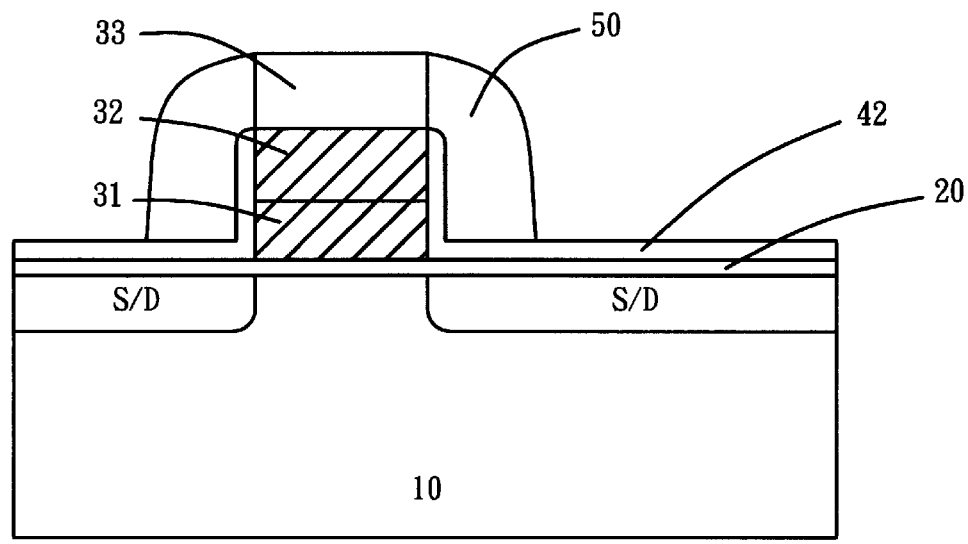
Figure 4D:
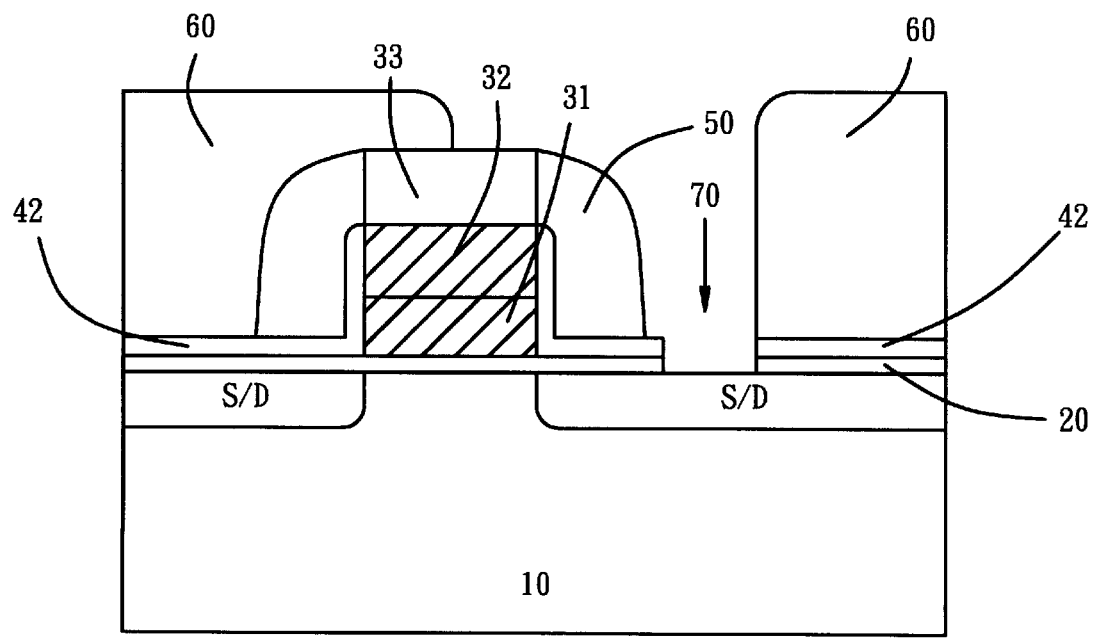

Since the WSi layer 32 and polysilicon layer 31 have a native oxide, its thickness being about 10–20 Å, on their surface, LPD-SiO$_2$ deposition occurs on the surface of the WSi layer 32 and the polysilicon layer 31. Next, Wafers 4 are held in a Teflon carrier 3 to deposit a LPD-SiO$_2$ layer 42, used as a stress-buffer layer, to a thickness of 50–300 Å only on the surface of the silicon substrate 10, the polysilicon layer 31, and the WSi layer 32, as shown in FIG. 4B. Subsequently, a nitride spacer 50 is formed at the sidewall of the stacked structure of the nitride cap 33, the WSi layer 32 and the polysilicon layer 31 after depositing a nitride layer over the exposed surface of the silicon substrate 10 and then etching the nitride layer back by reactive ion etching, as shown in FIG. 4C. Finally, a contact window 70 is formed after depositing a dielectric layer such as SiO$_2$ 60 and then exposing through a contact mask, developing and etching the dielectric layer 60, the LPD-SiO$_2$ layer 42 and the gate oxide 20, as shown in FIG. 4D. As mentioned before, the nitride spacer 50 has high etching selectivity with respect to the SiO$_2$ dielectric layer 60, a SAC etching will automatically stop at the nitride spacer 50 and thus a contact window 70 connected to a source/drain region is not spaced apart from the gate, thereby forming a self-aligned contact structure because of overlapping between the source/drain region and the gate.

As a result, several features that the conventional art can not achieve are concluded as following.

Figure 1A:
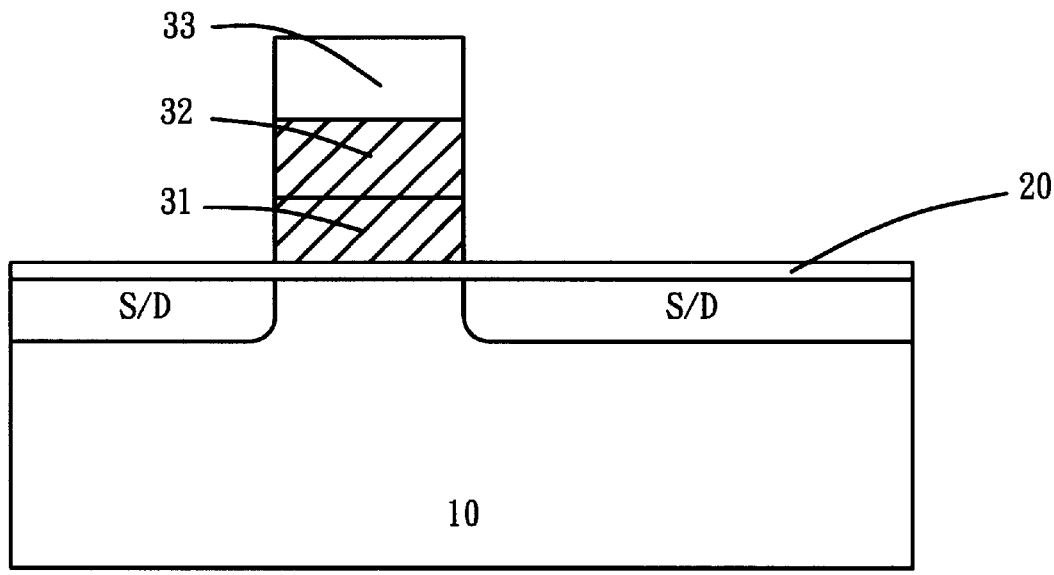
FIGS. 1A–1D are cross-sectional views of crucial steps of manufacturing a conventional SAC window.
Figure 1B:
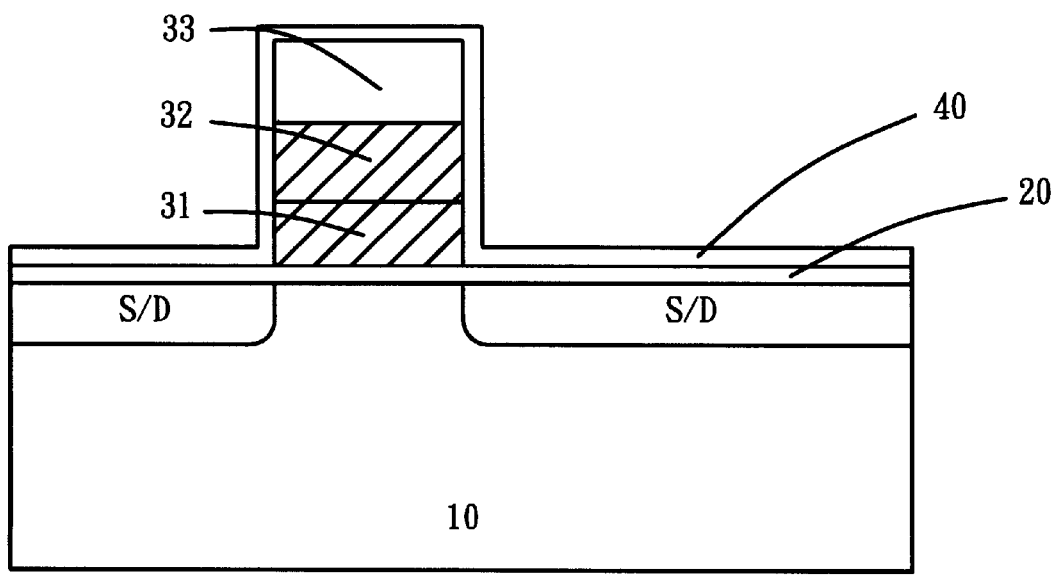
Figure 1C:
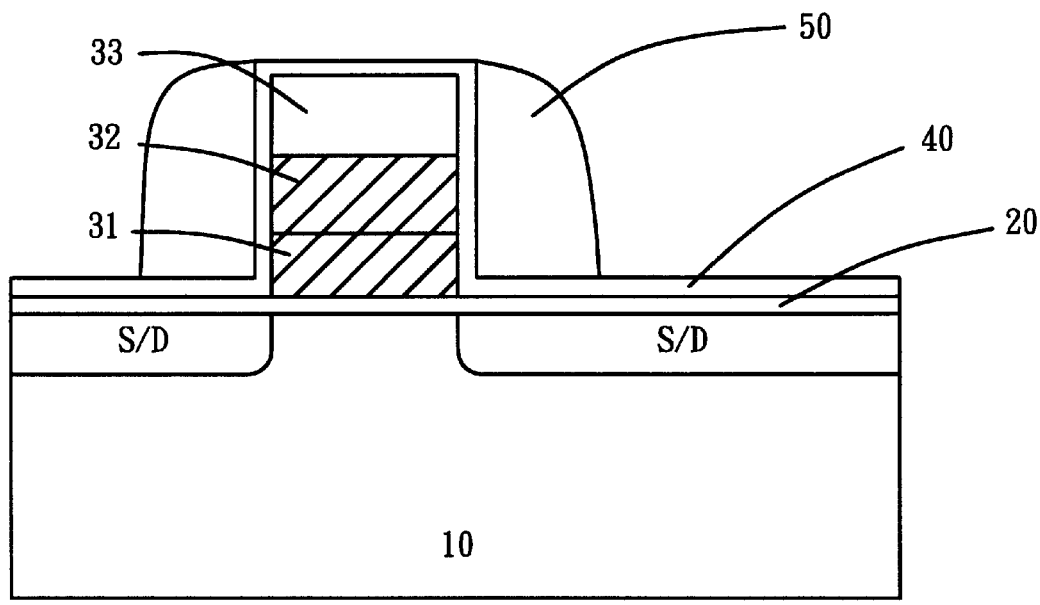
Figure 1D:
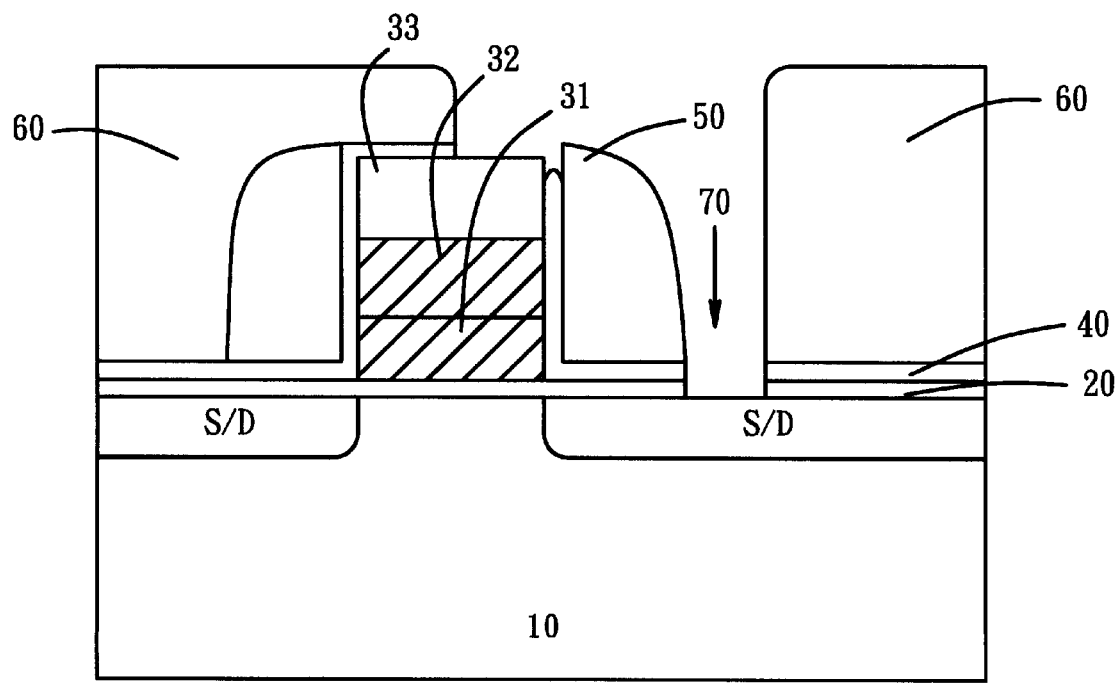

(1) An oxide layer 40 sandwiched between a nitride cap 33 and a nitride spacer 50, as shown in FIGS. 1C and 1D, will not occur in the invention, and thus the yield loss of conventional SAC window due to oxide layer 40 damage can be prevented by using a nitride spacer 50 to protect LPD-SiO$_2$ layer 42, as shown in FIGS. 4C and 4D, during a SAC etching.

Figure 2:
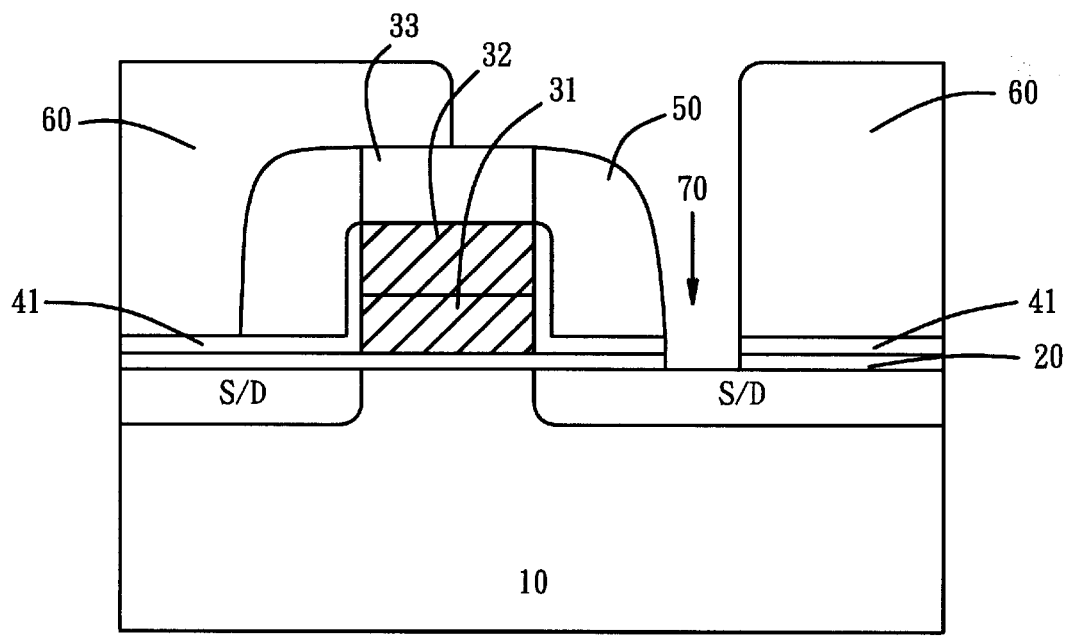
FIG. 2 is a cross-sectional view of a resulting structure of another conventional SAC window.

(2) The WSi peeling and distortion caused by a high temperature of thermal oxide layer 41 formation in a conventional SAC window formation, shown in FIG. 2, can be prevented by a LPD-SiO$_2$ film-formation method because of its low deposition temperature, being about 35° C. Thus, the invention has higher yield than that of conventional art.

Although the preferred embodiment of the invention has been disclosed for illustrative purposes, those skilled in the art will appreciate that various modifications, additions and substitutions are possible, without departing from the scope and spirit of the invention, as disclosed in the accompanying claims.

What is claimed is:

1. A method of forming a self-aligned contact window employing a process of liquid phase deposition (LPD) of a LPD-SiO$_2$ layer rather than a process of thermal oxidation to prevent peeling and distortion of a WSi layer so as to raise yields of the self-aligned contact window, comprising the steps of:

forming a gate oxide on the surface of a silicon substrate;

sequentially depositing a polysilicon layer, a WSi layer, and a nitride layer from bottom to top;

forming a nitride cap and a gate consisting of the polysilicon layer and the WSi layer by exposing, developing, and etching the nitride layer, the WSi layer, and the polysilicon layer;

forming source and drain regions;

forming the LPD-SiO$_2$ layer on the surface of the silicon substrate, the polysilicon layer and the WSi layer;

forming a nitride spacer by depositing a nitride layer over an exposed surface of the silicon substrate and then etching the nitride layer back; and depositing a dielectric layer and then exposing through a contact mask, developing and etching the dielectric layer, the LPD-SiO$_2$ layer and the gate oxide to form the self-aligned contact window.

2. The method of forming a self-aligned contact window according to claim 1, wherein the source and drain regions are lightly doped drain structures formed by two-time ion implantations.

3. The method of forming a self-aligned contact window according to claim 1, wherein the LPD-SiO$_2$ layer is formed from a source liquid of a supersaturated H2SiF6 solution.

4. The method of forming a self-aligned contact window according to claim 1 wherein the dielectric layer is SiO$_2$.

* * * * *